(12) United States Patent
Chen

(10) Patent No.: US 10,715,089 B1
(45) Date of Patent: Jul. 14, 2020

(54) CIRCUIT WITH CO-MATCHING TOPOLOGY FOR TRANSMITTING AND RECEIVING RF SIGNALS

(71) Applicant: Rafael Microelectronics, Inc., Hsinchu County (TW)

(72) Inventor: Kuan-Ming Chen, Hsinchu County (TW)

(73) Assignee: Rafael Microelectronics, Inc., Hsinchu County (TW)

( * ) Notice: Subject to any disclaimer, the term of this patent is extended or adjusted under 35 U.S.C. 154(b) by 54 days.

(21) Appl. No.: 16/234,581

(22) Filed: Dec. 28, 2018

(51) Int. Cl.
*H03F 3/191* (2006.01)
*H03F 1/56* (2006.01)
*H03F 3/195* (2006.01)
*H03F 3/213* (2006.01)
*H03F 3/72* (2006.01)

(52) U.S. Cl.
CPC ............. *H03F 1/565* (2013.01); *H03F 3/195* (2013.01); *H03F 3/213* (2013.01); *H03F 3/72* (2013.01); *H03F 2200/165* (2013.01); *H03F 2200/171* (2013.01); *H03F 2200/222* (2013.01); *H03F 2200/225* (2013.01); *H03F 2200/231* (2013.01); *H03F 2200/294* (2013.01); *H03F 2200/387* (2013.01); *H03F 2200/451* (2013.01)

(58) Field of Classification Search
CPC ........................................................ H03F 3/191
USPC .................................................. 330/302, 305
See application file for complete search history.

(56) References Cited

U.S. PATENT DOCUMENTS

2013/0207741 A1* 8/2013 Presti .................... H03H 7/48
333/111
2016/0285482 A1* 9/2016 Wada .................... H03H 7/463
2017/0019143 A1* 1/2017 Granger-Jones ......... H04B 1/48

* cited by examiner

*Primary Examiner* — Henry Choe
(74) *Attorney, Agent, or Firm* — Min-Lee Teng; Litron Patent & Trademark Office

(57) ABSTRACT

A circuit with co-matching topology for transmitting and receiving RF signals for return loss improvement, wherein when transmitting RF signals, the LNA is turned off and the capacitance of an adjustable capacitive component is adjusted for transmitting RF signals, and when receiving RF signals, the power amplifier and the adjustable capacitive component are turned off, wherein a matching network is designed in favor of the LNA for receiving RF signals while the adjustable capacitive component can adjust the overall impedance of the circuit including the matching network that is also used when transmitting RF signals and the adjustable capacitive component for improving the transmitting return loss.

9 Claims, 8 Drawing Sheets

(a) conventional configuration

CIRCUIT WITH CO-MATCHING TOPOLOGY FOR TRANSMITTING AND RECEIVING RF SIGNALS

BACKGROUND OF THE INVENTION

1. Field of the Invention

The invention relates to a circuit for transmitting and receiving RF signals, and in particular, but not exclusively, to a circuit with co-matching topology for transmitting and receiving RF signals.

2. Description of the Prior Art

FIG. 1 shows a conventional circuit for transmitting and receiving RF signals, wherein a physical switch selects a transmitting mode for transmitting an RF signal or a receiving mode for receiving an RF signal, and a dedicated matching circuit exists for each of the transmitting mode and the receiving mode. In such a design, the physical switch and the matching circuits add complexity to the board design, and in addition, the matching circuits are not fully utilized in either of the transmitting mode and the receiving mode.

FIG. 2 shows a conventional circuit for transmitting and receiving RF signals, wherein an embedded switch selects a transmitting mode for transmitting an RF signal or a receiving mode for receiving an RF signal, and wherein the matching circuit for the receiving mode is not fully utilized in transmitting mode.

Accordingly, there is a need to provide a better solution to resolve the aforementioned issues while increasing the performance of the circuit for transmitting and receiving RF signals.

SUMMARY OF THE INVENTION

One objective of the present invention is to provide a circuit with co-matching topology for transmitting and receiving RF signals, so that the matching circuit in transmitting mode can be used in receiving mode and the matching circuit in receiving mode can be used in transmitting mode so as to increase the performance of the circuit.

One objective of the present invention is to provide a circuit with co-matching topology for transmitting and receiving RF signals for return loss improvement, wherein when transmitting RF signals, the LNA is turned off and the capacitance of an adjustable capacitive component is adjusted for transmitting RF signals, and when receiving RF signals, the power amplifier and the adjustable capacitive component are turned off, wherein a matching network is designed in favor of the LNA for receiving RF signals while the adjustable capacitive component can adjust the overall impedance of the circuit including the matching network that is also used when transmitting RF signals and the adjustable capacitive component for improving the transmitting return loss.

The present invention discloses a circuit with co-matching topology for transmitting and receiving RF signals, said circuit comprising: a first sub-circuit, comprising a first inductive component, a first capacitive component and a second capacitive component, wherein a first terminal of the first inductive component is connected to a first terminal of the first capacitive component at a first node, and a second terminal of the first capacitive component is coupled to an antenna, wherein a first terminal of the second capacitive component is coupled to the first node and a second terminal of the second capacitive component is coupled to a ground; and a second sub-circuit, comprising a third capacitive component with adjustable capacitance, wherein a first terminal of the third capacitive component is coupled to an output terminal of a first amplifier and a second terminal of the third capacitive component is coupled to the ground; wherein the second terminal of the first inductive component is coupled to the output terminal of the first amplifier and the first terminal of the third capacitive component for the first amplifier to transmit a first RF signal to the antenna via a conductive path comprising the first inductive component and the first capacitive component, and wherein the second terminal of the first inductive component is coupled to an input terminal of a second amplifier for the second amplifier to receive a second RF signal from the antenna via said conductive path comprising the first inductive component and the first capacitive component.

In one embodiment, the first amplifier is a power amplifier and the second amplifier is an LNA.

In one embodiment, a second inductive component and a fourth capacitive component connected in parallel with a first terminal of the second inductive component connects with a first terminal of the fourth capacitive component at a second node, and a second terminal of the second inductive component connects with a second terminal of the fourth capacitive component at a third node, wherein the second node is coupled to a power supply and the third node is coupled to the output terminal of the first amplifier.

In one embodiment, the second inductive component and the fourth capacitive component operate at a resonant frequency, wherein said resonant frequency is 2.4 G Hz.

In one embodiment, the third capacitive component comprises a plurality of capacitors, wherein a first terminal of each of the plurality of capacitors is coupled to the output terminal of the first amplifier and a second terminal of each of the plurality of capacitors is coupled to a first terminal of a corresponding first switch with a second terminal of the corresponding first switch coupled to the ground, wherein each of the plurality of capacitors is conducted to the ground when the corresponding first switch of the capacitor is closed, and the second terminal of each of the plurality of capacitors is floating when the corresponding first switch of the capacitor is open, wherein when transmitting the first RF signal, at least one of the first switches is closed, and wherein when receiving the second RF signal, all of the first switches are open.

In one embodiment, the power amplifier comprises a first transistor having a first terminal, a second terminal, and a third terminal that is coupled to the ground, wherein the second terminal of the first transistor is connected to said output terminal of the power amplifier, and the first terminal of the first transistor of the power amplifier is selectively connected to a bias voltage or the ground via a corresponding second switch; and wherein the LNA comprises a second transistor having a fourth terminal that is connected to a power supply via a third switch, wherein when transmitting the first RF signal, the first terminal of the first transistor is selected to be connected to the bias voltage to turn on the power amplifier and the third switch is open to turn off the LNA, and wherein when receiving the second RF signal, the first terminal of the first transistor is selected to be connected to the ground to turn off the power amplifier and the third switch is closed to turn on the LNA.

In one embodiment, an output of a pre-amplifier is connected to the first terminal of the first transistor of the power amplifier, wherein the pre-amplifier comprises a third transistor having a fifth terminal that is connected to the power supply via a fourth switch, wherein when transmitting the first RF signal, the fourth switch is closed to turn on the pre-amplifier, and wherein when receiving the second RF signal, the fourth switch is open to turn off the pre-amplifier.

In one embodiment, the second terminal of the first inductive component is coupled to the output terminal of the first amplifier for transmitting the first RF signal via a first switch, and the second terminal of the first inductive component is coupled to the input terminal of the first amplifier for receiving the second RF signal via a second switch, wherein the first switch is closed and the second switch is open when transmitting the first RF signal, and wherein the first switch is open and the second switch is closed when receiving the second RF signal.

In one embodiment, the first sub-circuit and the second sub-circuit are integrated into a single chip.

The detailed technology and above preferred embodiments implemented for the present invention are described in the following paragraphs accompanying the appended drawings for people skilled in the art to well appreciate the features of the claimed invention.

BRIEF DESCRIPTION OF DRAWINGS

The foregoing aspects and many of the accompanying advantages of this invention will become more readily appreciated as the same becomes better understood by reference to the following detailed description when taken in conjunction with the accompanying drawings, wherein.

DETAILED DESCRIPTION OF EMBODIMENT

The detailed explanation of the present invention is described as follows. The described preferred embodiments are presented for purposes of illustrations and description, and they are not intended to limit the scope of the present invention.

Figure 1:
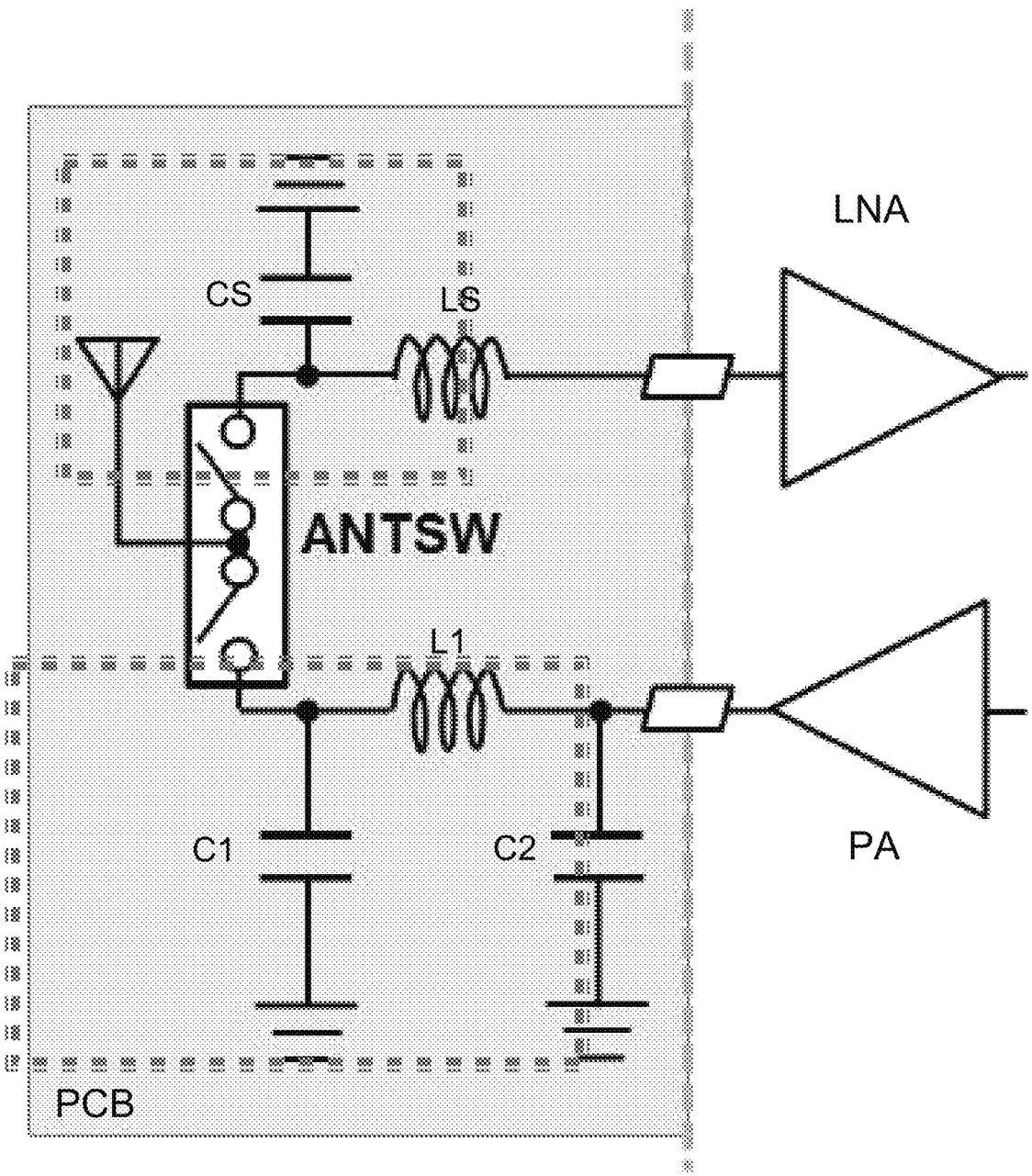
FIG. 1 illustrates a conventional circuit without having a co-matching topology for transmitting and receiving RF signals.
Figure 2:
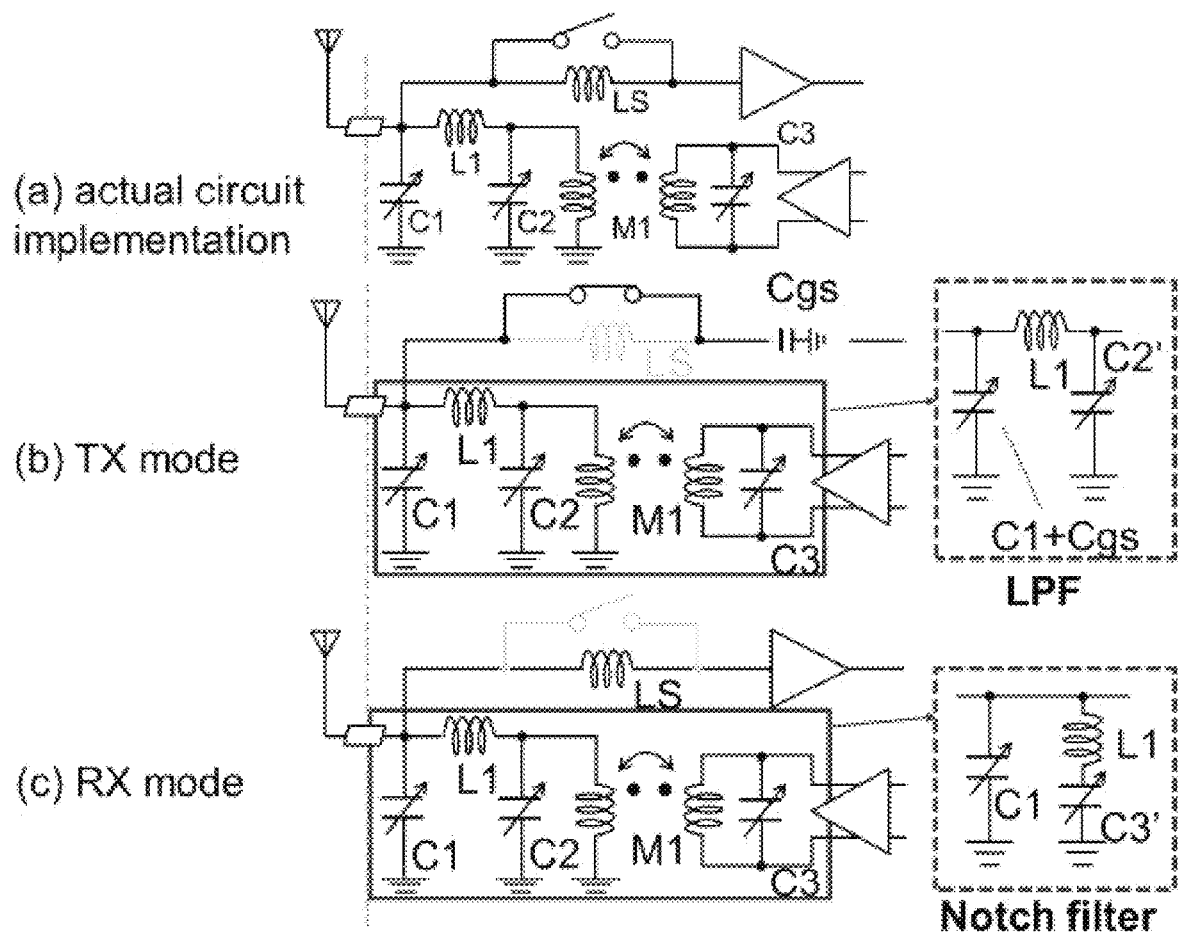
FIG. 2 illustrates a conventional circuit with a co-matching topology for transmitting and receiving RF signals.
Figure 3A:
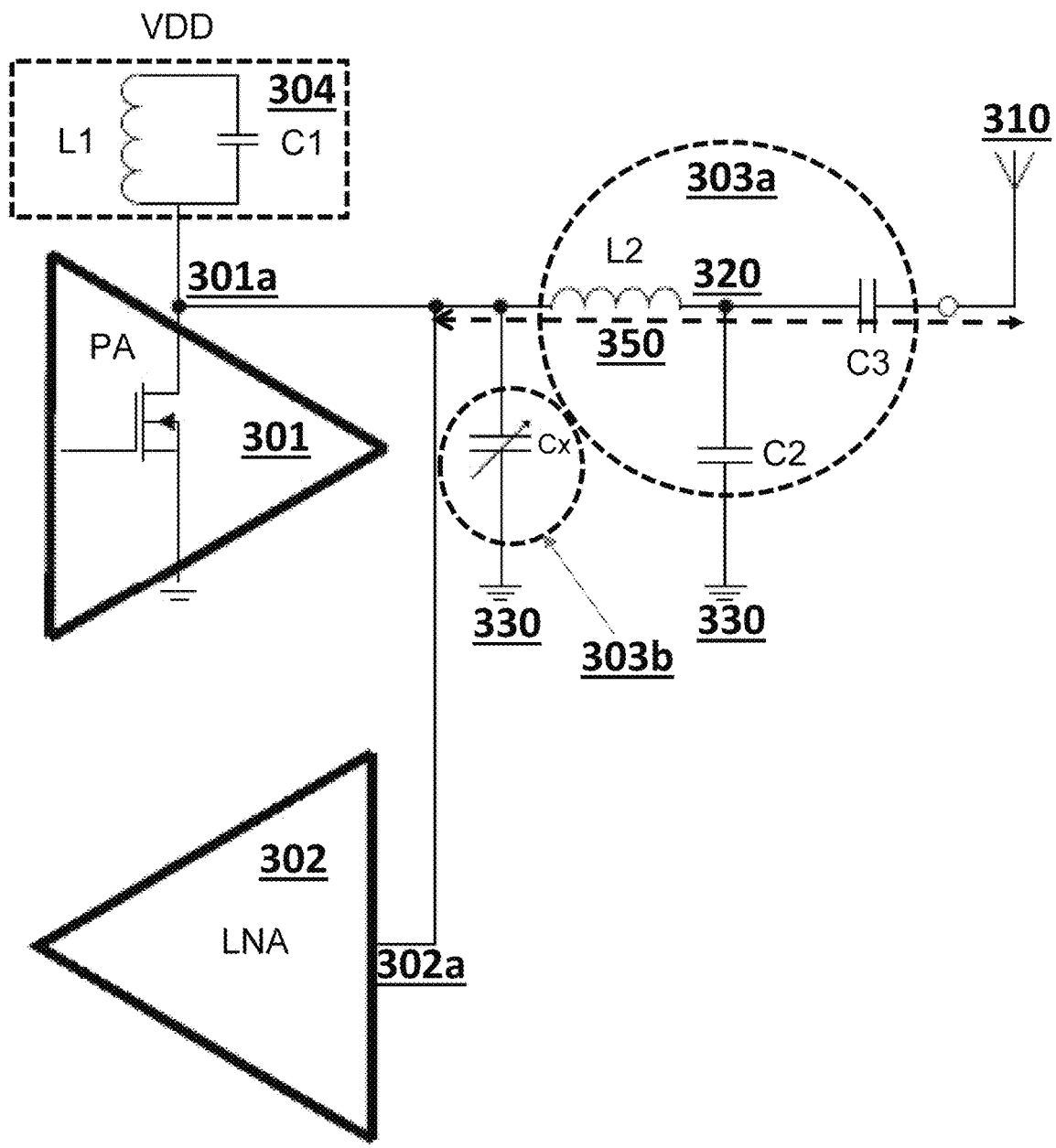
FIG. 3A illustrates a circuit with a co-matching topology for transmitting and receiving RF signals according to one embodiment of the present invention.

FIG. 3A illustrates a circuit with a co-matching topology for transmitting and receiving RF signals according to one embodiment of the present invention. As shown in FIG. 3A, the circuit 300 with a co-matching topology for transmitting and receiving RF signals comprises: a first sub-circuit 303a, comprising a first inductive component L2, a first capacitive component C3 and a second capacitive component C2, wherein a first terminal of the first inductive component is connected to a first terminal of the first capacitive component C3 at a first node 320, and a second terminal of the first capacitive component C3 is coupled to an antenna 310, wherein a first terminal of the second capacitive component C2 is coupled to the first node 320 and a second terminal of the second capacitive component C2 is coupled to a ground 330; and a second sub-circuit 303b, comprising a third capacitive component such as an adjustable capacitive component Cx with adjustable capacitance, wherein a first terminal of the adjustable capacitive component Cx is coupled to an output terminal 301a of a first amplifier such as a power amplifier (PA) 301 and a second terminal of the adjustable capacitive component Cx is coupled to the ground 330, wherein the second terminal of the first inductive L2 component is coupled to the output terminal 301a of the first amplifier such as the power amplifier (PA) 301 and the first terminal of the adjustable capacitive component Cx for the first amplifier such as the power amplifier (PA) 301 to transmit a first RF signal to the antenna 310 via a conductive path 350 comprising the first inductive component L2 and the first capacitive component C3, and wherein the second terminal of the first inductive component L2 is coupled to an input terminal 302a of a second amplifier such as a low-noise amplifier (LNA) 302 for the second amplifier such as the low-noise amplifier (LNA) 302 to receive a second RF signal from the antenna 310 via said conductive path 350 comprising the first inductive component L2 and the first capacitive component C3.

In one embodiment, the first sub-circuit 303a and the second sub-circuit 303b are integrated into a single chip.

In one embodiment, as shown in FIG. 3A, there is a sub-circuit 304 comprising a second inductive component L1 and a fourth capacitive component C1 connected in parallel with the second inductive component L1, wherein a first terminal of the second inductive component L1 and a first terminal of the fourth capacitive component C1 are coupled to a power supply VDD, and a second terminal of the second inductive component connects L1 and a second terminal of the fourth capacitive component C1 are coupled to the output terminal 301a of the power amplifier (PA) 301. In one embodiment, the second inductive component L1 and the fourth capacitive component C1 operate at a resonant frequency 2.4 G Hz that is the same as the operating frequency of the RF signal in the circuit 300 of FIG. 3A.

Figure 3B:
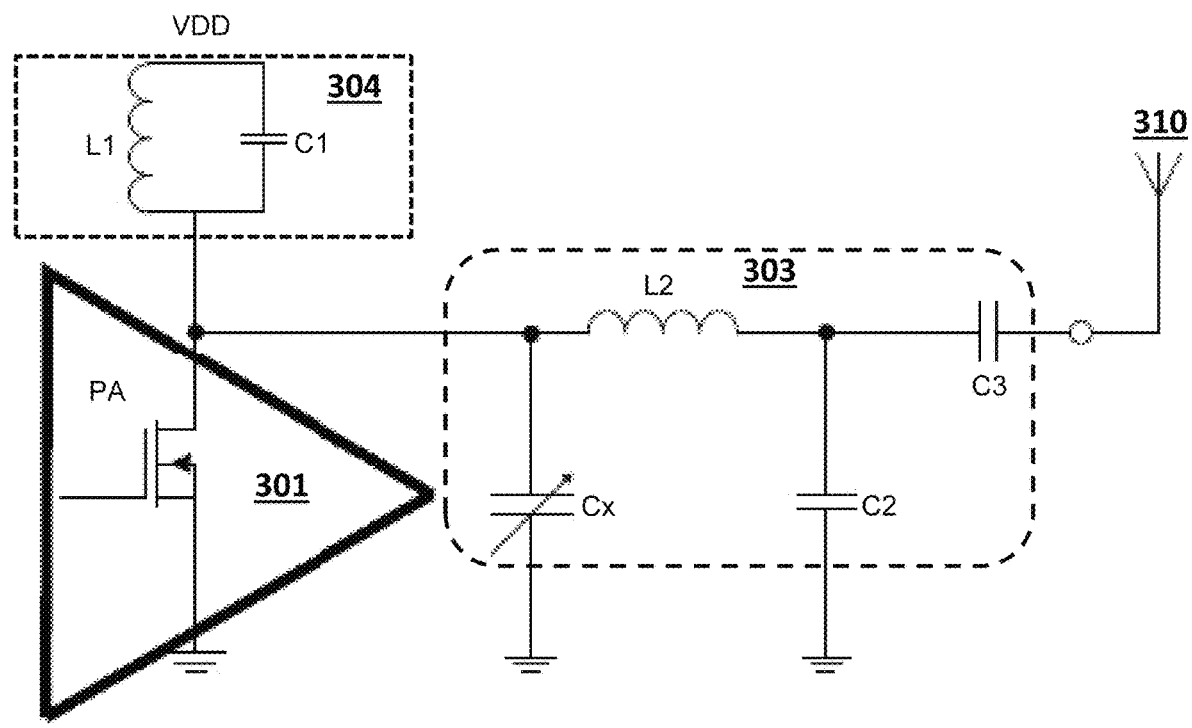
FIG. 3B illustrates the transmitting mode of the circuit of FIG. 3A.

As shown in FIG. 3B, when the power amplifier (PA) 301 is transmitting RF signals to the antenna 310 is in a transmitting mode of the circuit 300, the low-noise amplifier (LNA) 302 is turned off and the adjustable capacitive component Cx is turned on, wherein the capacitance of the adjustable capacitive component Cx can be adjusted so as to adjust the overall impedance of the transmitting matching network 303 that includes the first sub-circuit 303a used as a matching network for receiving RF signals and the second sub-circuit 303b that has the adjustable capacitive component Cx as shown in FIG. 3A, so that a trade-off between return loss and output transmit power can be achieved via the adjusted capacitance of the adjustable capacitive component Cx. By doing so, the circuit 300 of FIG. 3A does not need any physical switch in the data path from the power amplifier (PA) 301 to the antenna 310 or from the antenna 310 to the low-noise amplifier (LNA) 302.

Figure 3C:
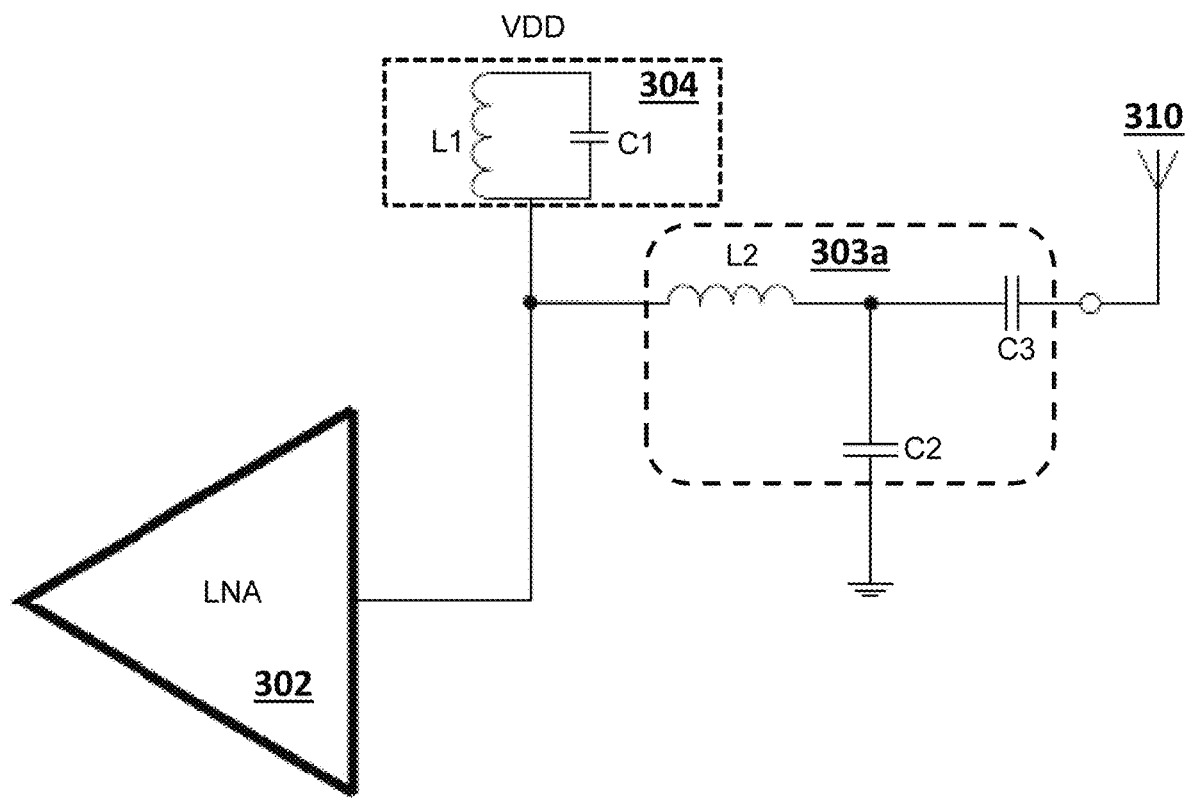
FIG. 3C illustrates the receiving mode of the circuit of FIG. 3A.

As shown in FIG. 3C, when the low-noise amplifier (LNA) 302 is receiving RF signals from the antenna 310, the power amplifier (PA) 301 and the adjustable capacitive component Cx are turned off so that they do not appear in FIG. 3C. Please note that the first sub-circuit 303a used as a matching network can be designed in favor of the low-noise amplifier (LNA) 302 so as to achieve conjugate-matching for a better Noise Figure (NF) and return loss. In addition, as shown in FIG. 3C, the inductance of the second inductive component L1 and the capacitance of the fourth capacitive component C1 can be chosen so that the sub-circuit 304 can resonate at a predetermined frequency for increasing the RF signal quality received by the low-noise amplifier (LNA) 302.

Figure 4A:
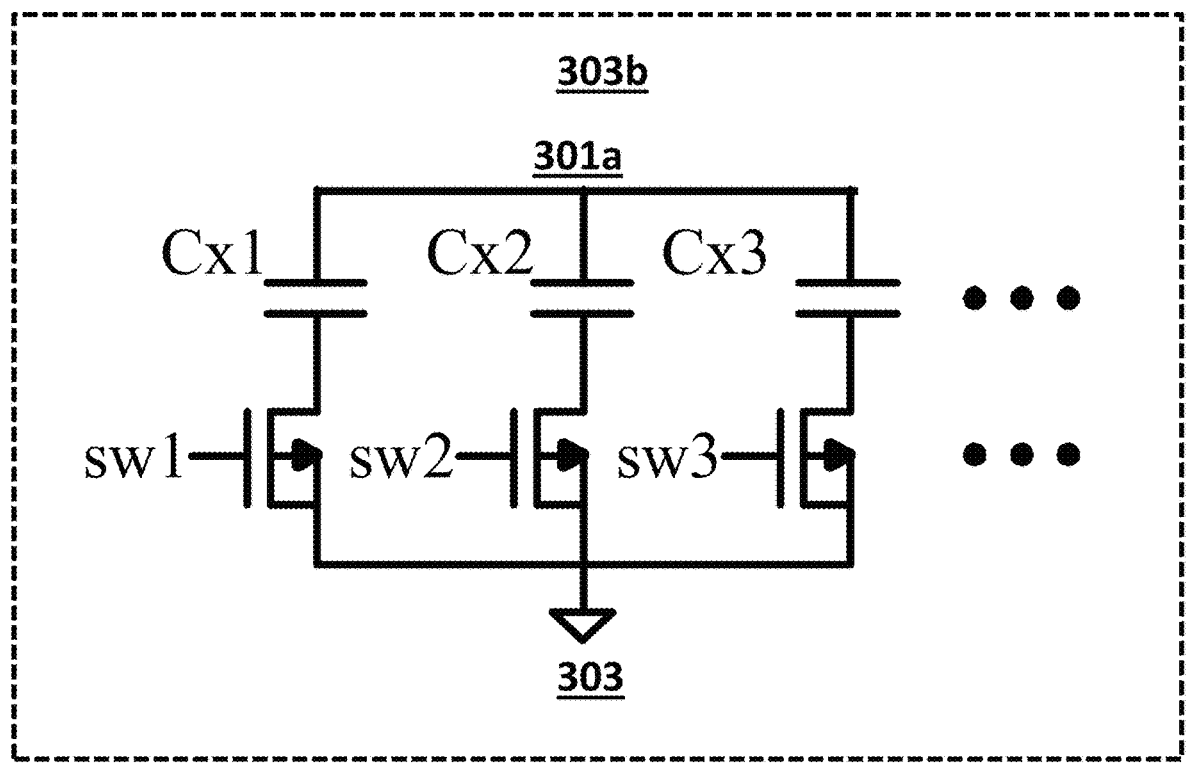
FIG. 4A illustrates an example to implement the adjustable capacitive component Cx in FIG. 3A.

In one embodiment, FIG. 4A shows an example of implementing the adjustable capacitive component Cx in the sub-circuit 303b of FIG. 3A. As shown in FIG. 4A, the adjustable capacitive component Cx has a plurality of capacitors Cx1, Cx2, Cx3, wherein a first terminal of each of the plurality of capacitors Cx1, Cx2, Cx3 is coupled to the output terminal 301a of the power amplifier (PA) 301 and a second terminal of each of the plurality of capacitors Cx1, Cx2, Cx3 is coupled to a first terminal of a corresponding switch of the switches SW1, SW2, SW3 with a second terminal of each of the plurality of capacitors Cx1, Cx2, Cx3 coupled to the ground 303, wherein each of the plurality of capacitors is conducted to the ground 303 when its corresponding switch is turned on, and the second terminal of each of the plurality of capacitors is floating when its corresponding switch is turned off, wherein when the power amplifier (PA) 301 is transmitting RF signals, at least one of the switches SW1, SW2, SW3 is turned on, and when the low-noise amplifier (LNA) 302 is receiving the RF signals, all of the switches SW1, SW2, SW3 are turned off. In one embodiment, each of the plurality of capacitors Cx1, Cx2, Cx3 can have a pre-determined capacitance.

Figure 4B:
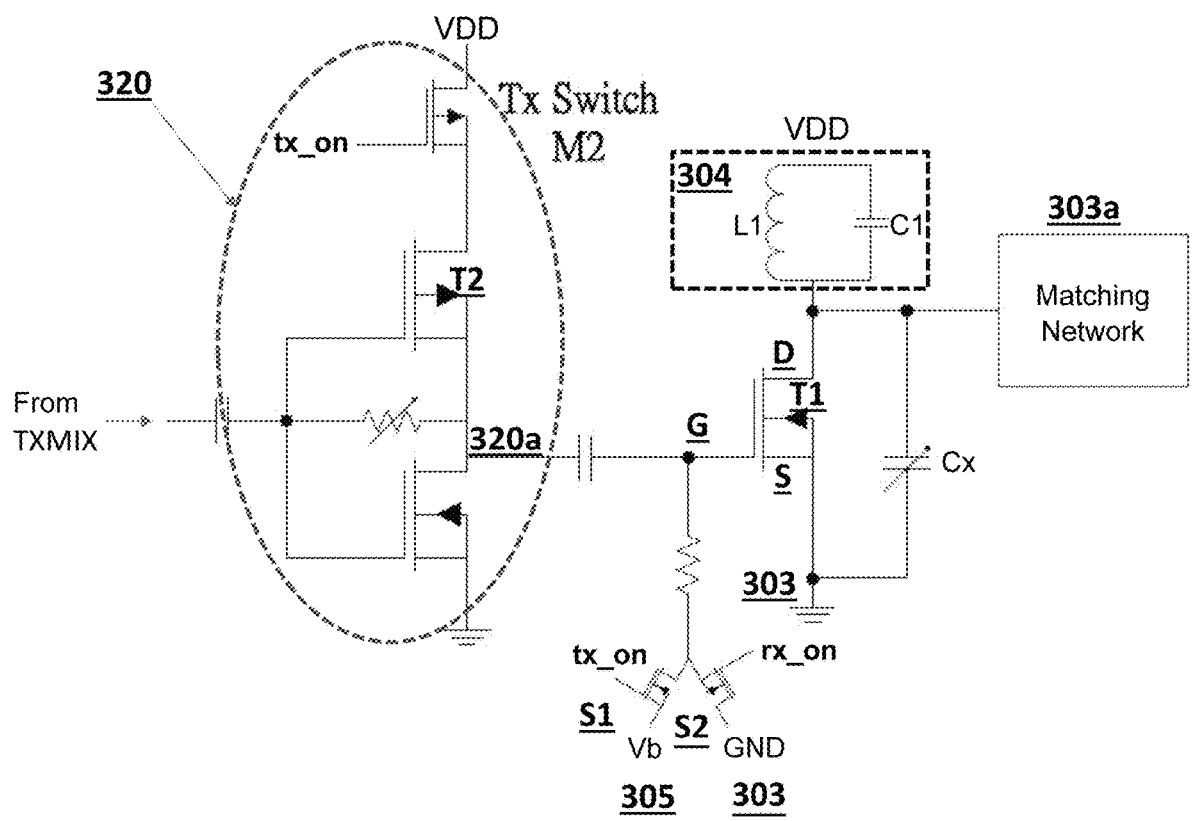
FIG. 4B illustrates an example to implement the power amplifier (PA) in FIG. 3A.
Figure 4C:
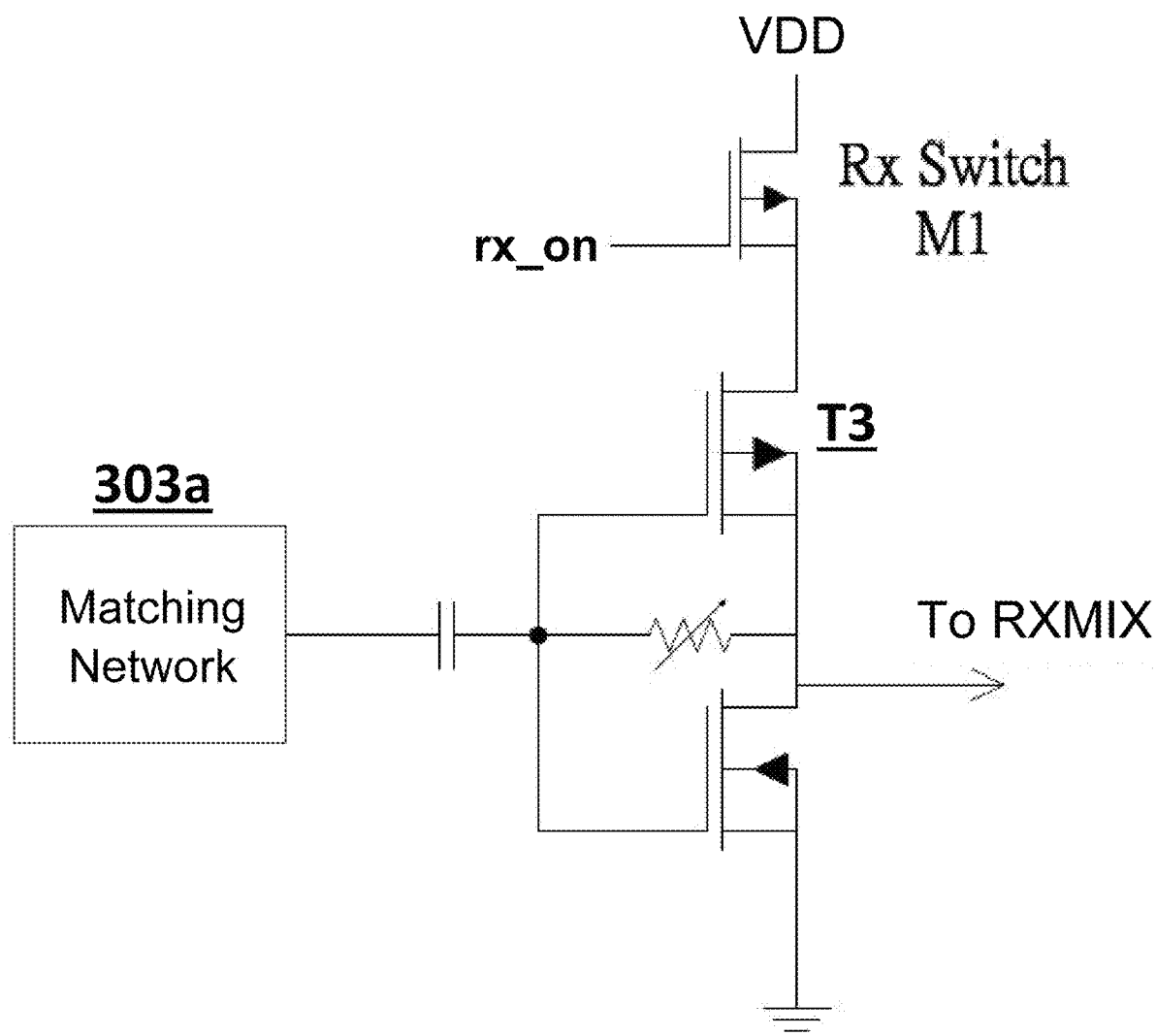
FIG. 4C illustrates an example to implement the low-noise amplifier (LNA) in FIG. 3A.

FIG. 4B shows an example of implementing the power amplifier (PA) 301 and FIG. 4C shows an example of implementing the low-noise amplifier (LNA) 302. As shown in FIG. 4B and FIG. 4C, the power amplifier (PA) 301 has a transistor T1 having a first terminal such as a gate terminal G, a second terminal such as a drain terminal D, and a third terminal such as a source terminal S that is coupled to the ground 303, wherein the drain terminal D of the transistor T1 is connected to the output terminal 301a of the power amplifier (PA) 301, and the gate terminal G of the transistor T1 of the power amplifier (PA) 301 is selectively connected to a bias voltage (VB) 305 or the ground 303 via switches S1, S2, wherein when the power amplifier (PA) 301 is transmitting RF signals, the switch S1 is turned on and the switch S2 is turned off, and when the low-noise amplifier (LNA) 302 is receiving RF signals, the switch S2 is turned on and the switch S1 is turned off. The low-noise amplifier (LNA) 302 has a transistor T3 having a fourth terminal such as a drain terminal that is connected to the power supply VDD via a switch Rx Switch M1. When the power amplifier (PA) 301 is transmitting RF signals, the gate terminal G of the transistor T1 of the power amplifier (PA) 301 is connected to a bias voltage (VB) 305 by enabling the control signal tx_on to turn on the switch S1 so as to turn on the power amplifier (PA) 301, and the switch Rx Switch M1 is turned off by disabling the control signal rx_on so as to turn off the low-noise amplifier (LNA) 302. When the low-noise amplifier (LNA) 302 is receiving RF signals, the gate terminal G of the transistor T1 of the power amplifier (PA) 301 is connected to the ground 303 by enabling the control signal rx_on to turn on the switch S2 so as to turn off the power amplifier (PA) 301, and the switch Rx Switch M1 is turned on so as to turn on the low-noise amplifier (LNA) 302 for generating signals to a receiving mixer RXMIX, as shown in FIG. 4C.

In one embodiment, as shown in FIG. 4B, an output 320a of a pre-amplifier 320 is connected to the gate terminal G of the transistor T1 of the power amplifier (PA) 301, wherein the pre-amplifier 320 has a transistor T2 having a fifth terminal such as a drain terminal that is connected to the power supply VDD via a switch Tx Switch M2, wherein when the power amplifier (PA) 301 is transmitting RF signals, the switch Tx Switch M2 is turned on by enabling the control signal tx_on so as to turn on the pre-amplifier 320, and when the low-noise amplifier (LNA) 302 is receiving RF signals, the switch Tx Switch M2 is turned off by disabling the control signal tx_on so as to turn off the pre-amplifier 320 for receiving the signal from a transmitting mixer TXMIX, as shown in FIG. 4B.

In another embodiment, the second terminal of the first inductive component L1 is coupled to the output terminal 301a of the power amplifier (PA) 301 via a switch, and the second terminal of the first inductive component L1 is coupled to the input terminal 302a of the low-noise amplifier (LNA) 302 via another switch, wherein said switch is turned on and said another switch is turned off when the power amplifier (PA) 301 is transmitting RF signals, and wherein said switch is turned off and said another switch is turned on when the low-noise amplifier (LNA) 302 is receiving RF signals.

The foregoing descriptions of specific embodiments of the present invention have been presented for purposes of illustrations and description. They are not intended to be exclusive or to limit the invention to the precise forms disclosed, and obviously many modifications and variations are possible in light of the above teaching. The embodiments were chosen and described in order to best explain the principles of the invention and its practical application to thereby enable others skilled in the art to best utilize the invention and various embodiments with various modifications as are suited to the particular use contemplated. It is intended that the scope of the invention be defined by the claims appended hereto and their equivalents.

What is claimed is:

1. A circuit with co-matching topology for transmitting and receiving RF signals, said circuit comprising:
   a first sub-circuit, comprising a first inductive component, a first capacitive component and a second capacitive component, wherein a first terminal of the first inductive component is connected to a first terminal of the first capacitive component at a first node, and a second terminal of the first capacitive component is coupled to an antenna, wherein a first terminal of the second capacitive component is coupled to the first node and a second terminal of the second capacitive component is coupled to a ground; and
   a second sub-circuit, comprising a third capacitive component with adjustable capacitance, wherein a first terminal of the third capacitive component is coupled to an output terminal of a first amplifier and a second terminal of the third capacitive component is coupled to the ground;
   wherein the second terminal of the first inductive component is coupled to the output terminal of the first amplifier and the first terminal of the third capacitive component for the first amplifier to transmit a first RF signal to the antenna via a conductive path comprising the first inductive component and the first capacitive component, and wherein the second terminal of the first inductive component is coupled to an input terminal of a second amplifier for the second amplifier to receive a second RF signal from the antenna via said conductive path comprising the first inductive component and the first capacitive component.

2. The circuit of claim 1, wherein the first amplifier is a power amplifier and the second amplifier is an LNA.

3. The circuit of claim 2, further comprising a second inductive component and a fourth capacitive component connected in parallel with a first terminal of the second inductive component connects with a first terminal of the fourth capacitive component at a second node, and a second terminal of the second inductive component connects with a second terminal of the fourth capacitive component at a third node, wherein the second node is coupled to a power supply and the third node is coupled to the output terminal of the first amplifier.

4. The circuit of claim 3, wherein the second inductive component and the fourth capacitive component operate at a resonant frequency, wherein said resonant frequency is 2.4 G Hz.

5. The circuit of claim 2, wherein the third capacitive component comprises a plurality of capacitors, wherein a first terminal of each of the plurality of capacitors is coupled to the output terminal of the first amplifier and a second terminal of each of the plurality of capacitors is coupled to a first terminal of a corresponding first switch with a second terminal of the corresponding first switch coupled to the ground, wherein each of the plurality of capacitors is conducted to the ground when the corresponding first switch of the capacitor is closed, and the second terminal of each of the plurality of capacitors is floating when the corresponding first switch of the capacitor is open, wherein when transmitting the first RF signal, at least one of the first switches is closed, and wherein when receiving the second RF signal, all of the first switches are open.

6. The circuit of claim 5, wherein the power amplifier comprises a first transistor having a first terminal, a second terminal, and a third terminal that is coupled to the ground, wherein the second terminal of the first transistor is connected to said output terminal of the power amplifier, and the first terminal of the first transistor of the power amplifier is selectively connected to a bias voltage or the ground via a corresponding second switch; and wherein the LNA comprises a second transistor having a fourth terminal that is connected to a power supply via a third switch, wherein when transmitting the first RF signal, the first terminal of the first transistor is selected to be connected to the bias voltage to turn on the power amplifier and the third switch is open to turn off the LNA, and wherein when receiving the second RF signal, the first terminal of the first transistor is selected to be connected to the ground to turn off the power amplifier and the third switch is closed to turn on the LNA.

7. The circuit of claim 6, wherein an output of a pre-amplifier is connected to the first terminal of the first transistor of the power amplifier, wherein the pre-amplifier comprises a third transistor having a fifth terminal that is connected to the power supply via a fourth switch, wherein when transmitting the first RF signal, the fourth switch is closed to turn on the pre-amplifier, and wherein when receiving the second RF signal, the fourth switch is open to turn off the pre-amplifier.

8. The circuit of claim 2, wherein the second terminal of the first inductive component is coupled to the output terminal of the first amplifier for transmitting the first RF signal via a first switch, and the second terminal of the first inductive component is coupled to the input terminal of the first amplifier for receiving the second RF signal via a second switch, wherein the first switch is closed and the second switch is open when transmitting the first RF signal, and wherein the first switch is open and the second switch is closed when receiving the second RF signal.

9. The circuit of claim 1, wherein the first sub-circuit and the second sub-circuit are integrated into a single chip.

* * * * *